(12) United States Patent
Budillon et al.

(10) Patent No.: US 7,078,888 B2
(45) Date of Patent: Jul. 18, 2006

(54) ELECTRIC CURRENT MEASURING DEVICE, CURRENT SENSOR, ELECTRIC TRIP UNIT AND BREAKING DEVICE COMPRISING SUCH A MEASURING DEVICE

(75) Inventors: Gilles Budillon, Charnecles (FR); Sébastien Buffat, Seyssins (FR); Pascal Houbre, Jarrie (FR); Frédéric Toti-Buttin, Pont de Claix (FR)

(73) Assignee: Schneider Electric Industries SAS (FR)

( * ) Notice: Subject to any disclaimer, the term of this patent is extended or adjusted under 35 U.S.C. 154(b) by 0 days.

(21) Appl. No.: 11/117,439

(22) Filed: Apr. 29, 2005

(65) Prior Publication Data

US 2005/0253573 A1 Nov. 17, 2005

(30) Foreign Application Priority Data

May 13, 2004 (FR) .................................. 04 05199

(51) Int. Cl.
*G01R 15/18* (2006.01)
*G01R 15/20* (2006.01)

(52) U.S. Cl. .................................. 324/127; 324/117 H

(58) Field of Classification Search ................. 324/126, 324/127, 117 H
See application file for complete search history.

(56) References Cited

U.S. PATENT DOCUMENTS

| 4,709,205 | A | * | 11/1987 | Baurand et al. | ............. 324/127 |
| 5,012,218 | A | | 4/1991 | Haug et al. | .................. 336/174 |
| 5,617,019 | A | * | 4/1997 | Etter | ....................... 324/117 R |
| 6,018,239 | A | * | 1/2000 | Berkcan et al. | .............. 324/127 |
| 6,094,043 | A | * | 7/2000 | Scott et al. | ............. 324/117 R |
| 6,295,190 | B1 | | 9/2001 | Rinaldi et al. | ............... 361/115 |
| 6,624,622 | B1 | * | 9/2003 | Noh | ........................... 324/72.5 |

FOREIGN PATENT DOCUMENTS

FR 2507811 6/1981

\* cited by examiner

*Primary Examiner*—Paresh Patel
*Assistant Examiner*—Roberto Velez
(74) *Attorney, Agent, or Firm*—Steptoe & Johnson LLP

(57) ABSTRACT

The Rogowski type current measuring device comprises at least three coils electrically connected in series and forming a closed polygonal outline designed to surround a conductor to perform current measurement. The local inductance of at least one of the ends of said coils is greater than the local inductance towards the central part of said coils.

14 Claims, 5 Drawing Sheets

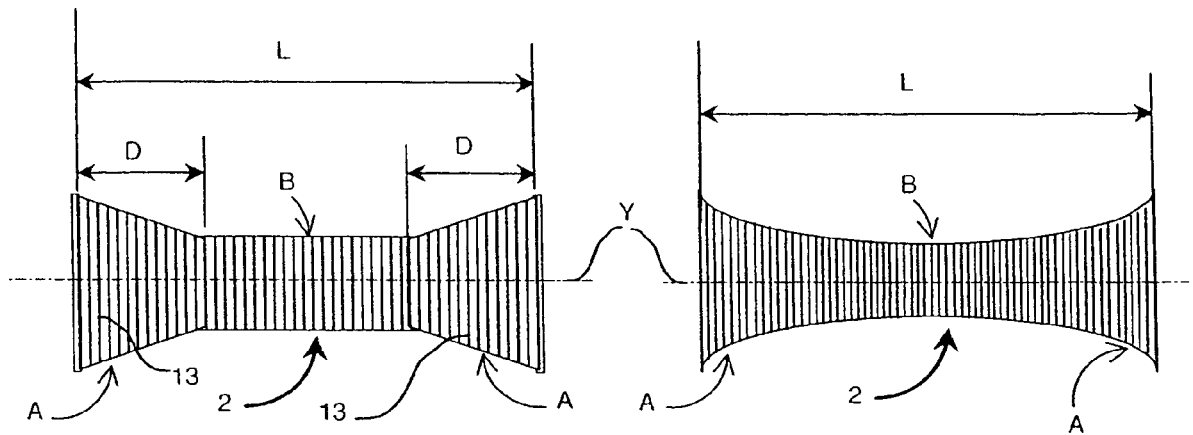
Fig. 5                     Fig. 6
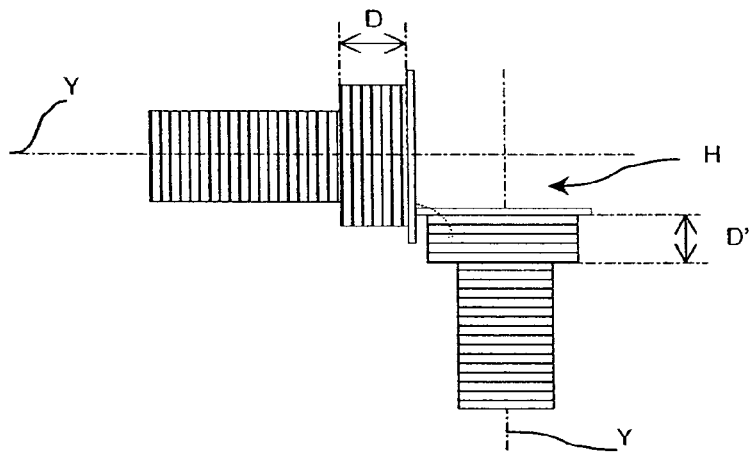
Fig. 7
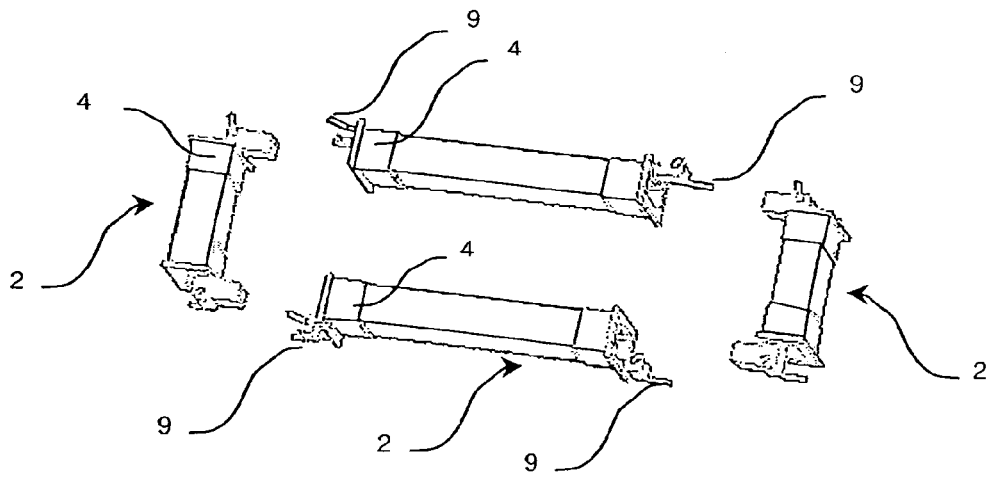
Fig. 8

ELECTRIC CURRENT MEASURING DEVICE, CURRENT SENSOR, ELECTRIC TRIP UNIT AND BREAKING DEVICE COMPRISING SUCH A MEASURING DEVICE

The present application is based on French Application No. 04 05199, filed May 13, 2004, which application is incorporated herein by reference in its entirety.

BACKGROUND OF THE INVENTION

The invention relates to a current measuring device of the Rogowski type comprising at least three coils electrically connected in series and forming a closed polygonal outline designed to surround a conductor to perform current measurement.

STATE OF THE ART

The use of current measuring devices comprising Rogowski type inductive sensors is extensively described in the literature.

Rogowski type current measuring devices comprise a support made of non-magnetic material placed around a current conductor or line wherein the current to be measured flows. A conducting wire is coiled onto the support to form a secondary winding. The assembly forms a transformer where said current conductor or line constitutes a primary winding and said secondary winding supplies a measurement signal. The voltage supplied at the terminals of the secondary winding is directly proportional to the intensity of the electric current flowing in the current conductor or line. The fact that there is no magnetic core liable to be saturated enables a wide measuring range to be achieved.

To obtain a voltage measurement independent from the position of the conductor in the support and to suppress the influence of another conductor placed outside the support, the number of turns per unit length must be constant over the whole length of the coil and the turns must be joined.

Certain solutions (U.S. Pat. No. 4,611,191, WO 01/57,543 A1) comprise coils in the form of toroidal solenoids. The electric wire can then be wound onto a toroidal non-conducting support of circular or rectangular cross-section. Although they are very efficient, solutions using a closed toroid remain difficult to industrialize due to the geometry of the toroid. Winding of a toroid in fact remains complex and this is particularly true when the size of the current measuring device is small.

To remedy these realization problems, other solutions consist in using an assembly of several coils electrically connected in series and arranged with a polygonal outline. Each side of the polygon is then formed by a linear or quasi-linear coil. Globally speaking, the larger the number of coils used, the closer the general shape of the polygon is to that of a cylindrical toroid (U.S. Pat. No. 3,262,6291, DE 19,731,170).

In order to optimize industrial achievement of the polygon, solutions using polygonal outlines with four sides of square or rectangular shape can be used (EP 209,415, FR 2,507,811, DE 2,432,919). As represented in FIG. 1, the current measuring device 1 is then formed by four linear coils 2 electrically connected in series the longitudinal axes Y whereof are placed in the same radial plane. The primary conductor 7 on which current measurement is performed is placed inside the current measuring device in a direction perpendicular to said radial plane of the current measuring device 1.

However, these solutions sometimes present the drawback of being too sensitive to phenomena external to the polygon. Measurement of the current flowing in the conductor 7 can thus be made false.

Indeed, when several coils 2 are used to constitute a closed current measuring device of polygonal shape, a magnetic discontinuity zone H exists in the region of each connection between two coils 2. Unlike a current measuring device comprising a solenoid of perfect toroidal shape, the number of turns per unit length is no longer constant over the whole length of the winding of the measuring device. A structural discontinuity exists due to the fact that the last turn of a coil 2 is not joined with the first turn of the coil 2 that is directly connected to it. The mutual induction coefficient M0 between the current measuring device and an external circuit is not zero.

This structural discontinuity between two coils is all the larger the smaller the internal angle α formed between two coils of the polygon. The internal angles α between the coils of a current measuring device of square or rectangular polygonal shape are 90 degrees.

Certain state-of-the-art solutions (EP 0,838,686) compensate these discontinuities by arranging the four coils so that each end of a coil is partially or totally covered by the coil that is adjacent to it. This solution does not fully solve the problem relating to the influence of external fluxes on current measurement. In addition, problems of fitting the coils on their support are encountered.

Other solutions use pieces of magnetic cores placed only at the level of the structural discontinuities. Although they reduce the influence of stray external fluxes, these cores do however end up saturating in the presence of strong currents. In addition, the presence of these cores makes connection of the coils to one another more complex.

SUMMARY OF THE INVENTION

The object of the invention is therefore to remedy the drawbacks of the state of the art so as to propose an electric current measuring device that is less sensitive to external disturbances, is of reduced volume, and simplified industrialization.

A current measuring device according to the invention comprises coils, the local inductance of at least one of the ends of said coils being higher than the local inductance towards the central part of said coils.

Advantageously, the local inductance at both ends of said coils is higher than the local inductance towards the central part of said coils.

Advantageously, the ends of the coils the local inductance whereof is higher than the local inductance of the central part comprise a larger number of wire turns per unit length than the number of wire turns per unit length towards the central part of said coils.

Advantageously, the ends comprise a larger number of layers of wire turns than the number of layers of wire turns towards the central part of said coils, the winding pitch of the turns being constant.

In a particular embodiment, the ends comprise, on one and the same layer of turns, a smaller winding pitch of the turns than the winding pitch of the turns towards the central part of said coils.

Preferably, the variation of the number of turns at the two ends of the coils is made over a distance comprised between 10 and 20 percent of the total length of the coil.

According to a development of the invention, the ends of the coils the local inductance whereof is higher than the local inductance of the central part comprise turns of a greater length than that of the turns towards the central part of said coils.

In a particular embodiment, the radial surfaces of the ends of two coils are partially covered by the adjacent coils.

The current measuring device is preferably formed by four coils arranged so as to form a closed outline.

Advantageously, said outline has a square or rectangular polygonal shape.

A mixed current sensor comprising a magnetic current sensor having a coil wound round a magnetic circuit possesses a current measuring device as defined above arranged in such a way that the primary circuit of said magnetic sensor corresponds to the primary circuit of said current measuring device.

An electric trip unit comprises processing means connected to at least one current measuring device as defined above to receive at least one signal representative of a primary current.

A breaking device comprising an opening mechanism of electric contacts and a relay connected to a trip unit as defined above, the trip unit comprising a current measuring device as defined above.

BRIEF DESCRIPTION OF THE DRAWINGS

Other advantages and features will become more clearly apparent from the following description of a particular embodiment of the invention, given as a non-restrictive example only, and represented in the accompanying drawings in which:

FIGS. 5 to 7 represent alternative embodiments of the current measuring device according to FIG. 2;

FIGS. 8 to 10 represent perspective views of the coils in the course of assembly on the support;

DETAILED DESCRIPTION OF AN EMBODIMENT

Figure 1:
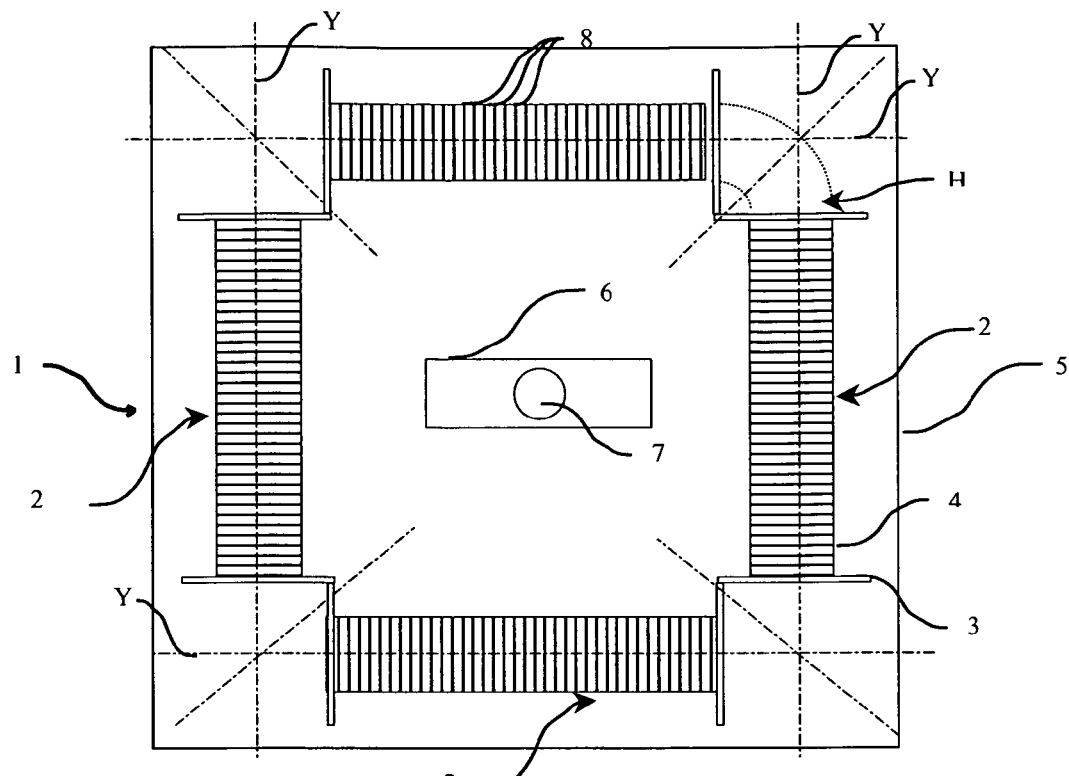
FIG. 1 represents a top view of a current measuring device of known type.
Figure 2:
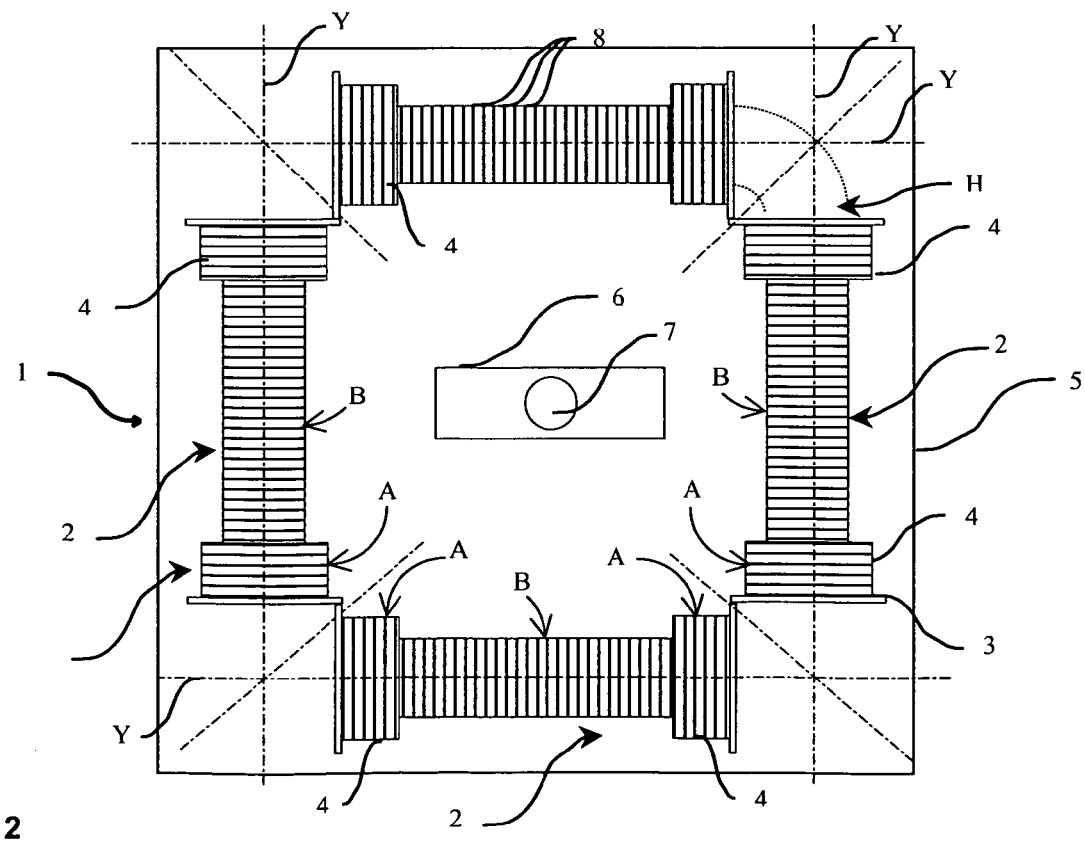
FIG. 2 represents a schematic top view of the current measuring device with four coils according to a preferred embodiment of the invention.

The current measuring device 1 comprises at least three linear coils 2 electrically connected in series and forming a closed polygonal outline. According to the preferred embodiment of the invention represented in FIG. 2, the current measuring device 1 comprises four linear coils 2 arranged in the same plane. The longitudinal axis Y of each coil is perpendicular to the respective longitudinal axes of the two coils placed physically next to it.

Each coil is composed of a hollow, rigid or semi-rigid, shell of linear shape, made of non-magnetic material, and having a cylindrical, square, rectangular or ovoid cross-section. A metallic wire made of copper or a copper-based alloy is wound on the shell.

Generally, the shells of known sensors have cross-sections of circular shape. However, such a shape does not enable a maximum cross-section to be had when the space or volume set aside for the sensors is limited. In the embodiment, the cross-section of the shells of the coils is of rectangular shape. Two flanges 3 are placed respectively at the two ends of said coils 2.

The coils 2 are electrically connected to one another in series. Each coil is fixed on a base 5 supporting the set of four coils. The base 5 is provided with a central opening 6 enabling the current conductor or line 7 on which the current measurement is made to pass through. This current conductor or line 7 forms the primary circuit of the current measuring device 1.

Figure 9:
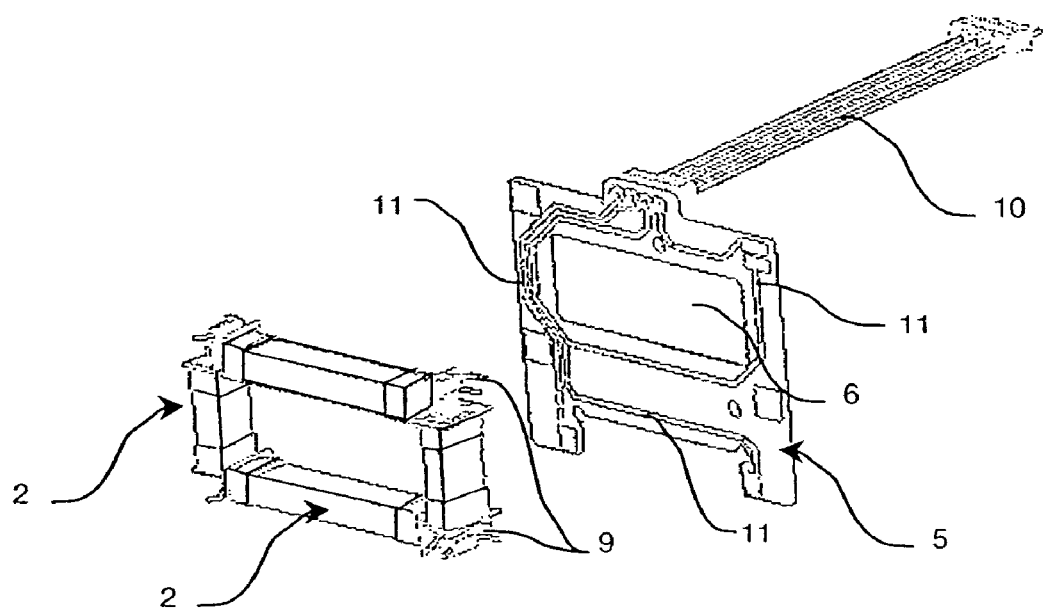
Figure 10:
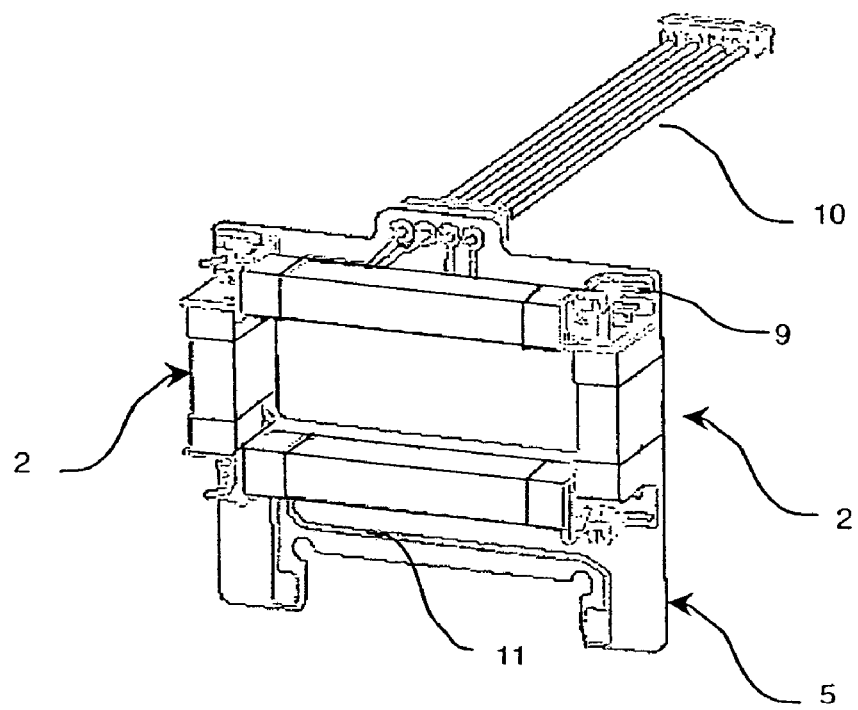

In the embodiment as presented in FIGS. 8 to 10, the base 5 is formed by a printed circuit. This circuit then ensures both mechanical fixing of the coils 2 and electrical interconnection thereof. The printed circuit also makes the external connections with a connection bus 10. The four coils 2 respectively have connecting pins 9 soldered directly onto the tracks 11 of the printed circuit.

Each coil 2 can comprise several layers of wire. Winding of the wire on any one layer is performed at constant pitch. In other words, on a layer, the number of turns 8 per unit length is constant. Moreover, the turns are preferably joined.

Each coil 2 bears either an even number of layers of wire, in which case the connecting pins 9 are situated on the same side of the coil shell, or an odd number of layers of wire, in which case the connecting pins 9 are situated on both sides of the shell. In the first case, the interconnection conducting tracks 11 of connecting pins 9 of adjacent coils have a length substantially equivalent to that of the shell. In the second case, the printed circuit advantageously bears a neutralization conducting track substantially surrounding the central opening 6. This track is arranged electrically in series and magnetically in opposition with the windings so as to neutralize the disturbance effects of the external magnetic fields.

Due to this arrangement of the four coils 2 in a square, four zones H of structural discontinuity implicitly exist where no turn 8 is present. The internal angles α formed between the coils of the polygon are then 90 degrees.

Figure 3:
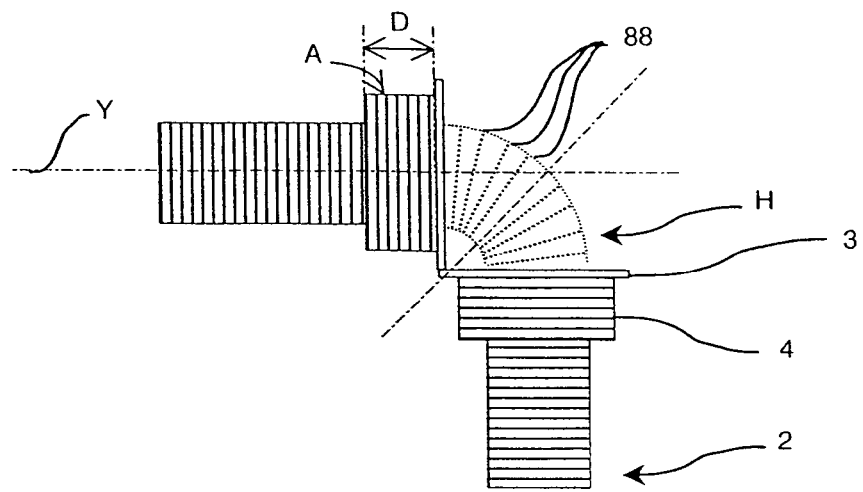
FIG. 3 represents an enlarged scale view of FIG. 2 corresponding to the junction zone of two coils.
Figure 4:
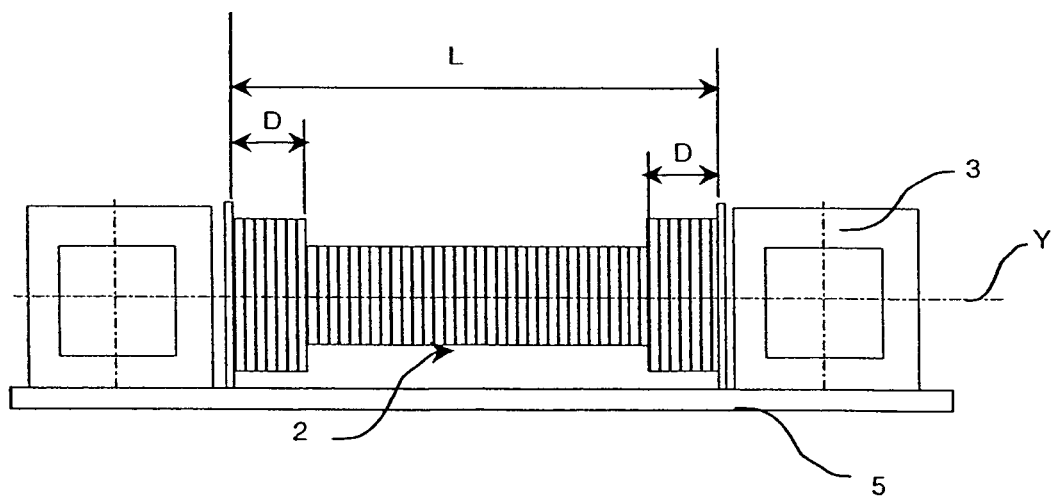
FIG. 4 represents a side view of the current measuring device according to FIG. 2.

Ideally, as represented schematically in FIG. 3, turns 88 should be arranged in the zone H to prevent any coil discontinuity on the perimeter of the sensor. The number of turns per unit length on these portions of arc would thus remain close to that of the linear portions.

To limit the harmful effects due to the lack of turns on these portions of the sensor, the invention consists in positioning compensation means of the discontinuity zones on the sensor. These compensation means consist in changing the inductance of the coils locally towards their respective ends. The invention in fact consists in increasing the inductance of the coils 2 locally at their ends A. The local inductance at the ends A is then greater than that observed locally towards the central part B of said coils 2.

Thus, according to the preferred embodiment of the invention, the device comprises coils 2 with windings of complementary turns on its two ends A. In this embodiment, the structural discontinuity is palliated by an electrical compensation. The number of turns 8 added to each end A is approximately equal to $1/\sqrt{2}$ times the number of turns lacking in the zone H. The over-coils 4 are made as close as possible to the two ends A. In the embodiment, the over-coils 4 are made over a distance D preferably comprised between ten and twenty percent of the total length L of the coil. Winding of the wire over the whole of each coil is preferably performed at constant pitch, for example with joined turns.

According to a first alternative embodiment, the effect of the over-coil is replaced by that of a variation of the winding pitch of the wire at the ends of each coil 2. On one and the same layer of wire, the winding pitch observed locally at the two ends A of the coils is in fact different from that observed locally towards the central part B of said coil. The winding pitch of the wire at the ends A is smaller than that existing locally towards the central part B of the coil. Thus, without it being necessary to increase the number of layers, the number of turns 8 of wire per unit length observed locally at the ends A is larger than the number of turns per unit length observed locally towards the central part B of the linear coil 2.

According to a second alternative embodiment as represented in FIGS. 5 and 6, the structural discontinuity can be compensated by a change of length of wire per coil turn at the level of the ends A of the coils 2. Each coil 2 is then achieved on a non-magnetic shell whose cross-section is not constant over its whole length L. The cross-section of the shell towards the two ends A must be greater than the cross-section towards the central part B. A shell can be envisaged composed of two frustum-shaped volumes arranged in such a way that the large bases of the cones correspond to the surfaces placed at the ends A of the shell. Another solution would consist in using a shell whose cross-section varies from one end A to the other following a profile corresponding to a portion of circle or parabola.

According to another alternative embodiment as represented in FIG. 7, the initial structural discontinuity is compensated on the one hand by an increase of the local inductance towards the ends A of the coils and on the other hand by a spatial offset of two coils. An electrical compensation is therefore combined with a geometric compensation. This geometric compensation consists in fact in placing two parallel coils in such a way that their end A partially covers the radial surfaces of the adjacent coils.

It can naturally be envisaged to combine these four embodiments of the invention with one another. It can in fact for example be envisaged to provide over-coils at the ends A of the coils 2 with windings which have variable pitches or to provide coils having variable cross-sections with windings with variable pitches. Furthermore, the same current measuring device 1 can comprise coils respectively achieved with different embodiments described above.

Furthermore, the solutions described above provide for all the ends A of all the coils 2 to have a modified local inductance. The discontinuity between two coils 2 is thus compensated due to the structural or electrical modification of the respective ends A of the two coils 2. It can also be envisaged to only modify a single end A of the two ends A of the two coils 2. In practice, over all of the coils 2 of the current measuring device 1, only one end A out of two will have a modified local inductance.

In general manner, the harmful effects or external disturbances have a greater influence on current measuring when the discontinuity zones H are large. In other words, the smaller the internal angle α between two coils, for example smaller than 90 degrees, the larger the structural discontinuity zone H and the more the disturbances will be felt. Thus, the compensation means according to the invention are more particularly designed for current sensors having coils arranged on a polygonal outline having at least eight sides. For polygons having more than eight sides, as the discontinuity zones H are relatively small, the necessity of adjoining compensation means thereto is therefore lesser.

The current measuring device 1 according to the different embodiments of the invention is particularly intended to be combined with a magnetic current sensor thus forming a mixed current sensor 20 composed of a magnetic sensor and a Rogowski type current measuring device 1.

Figure 12:
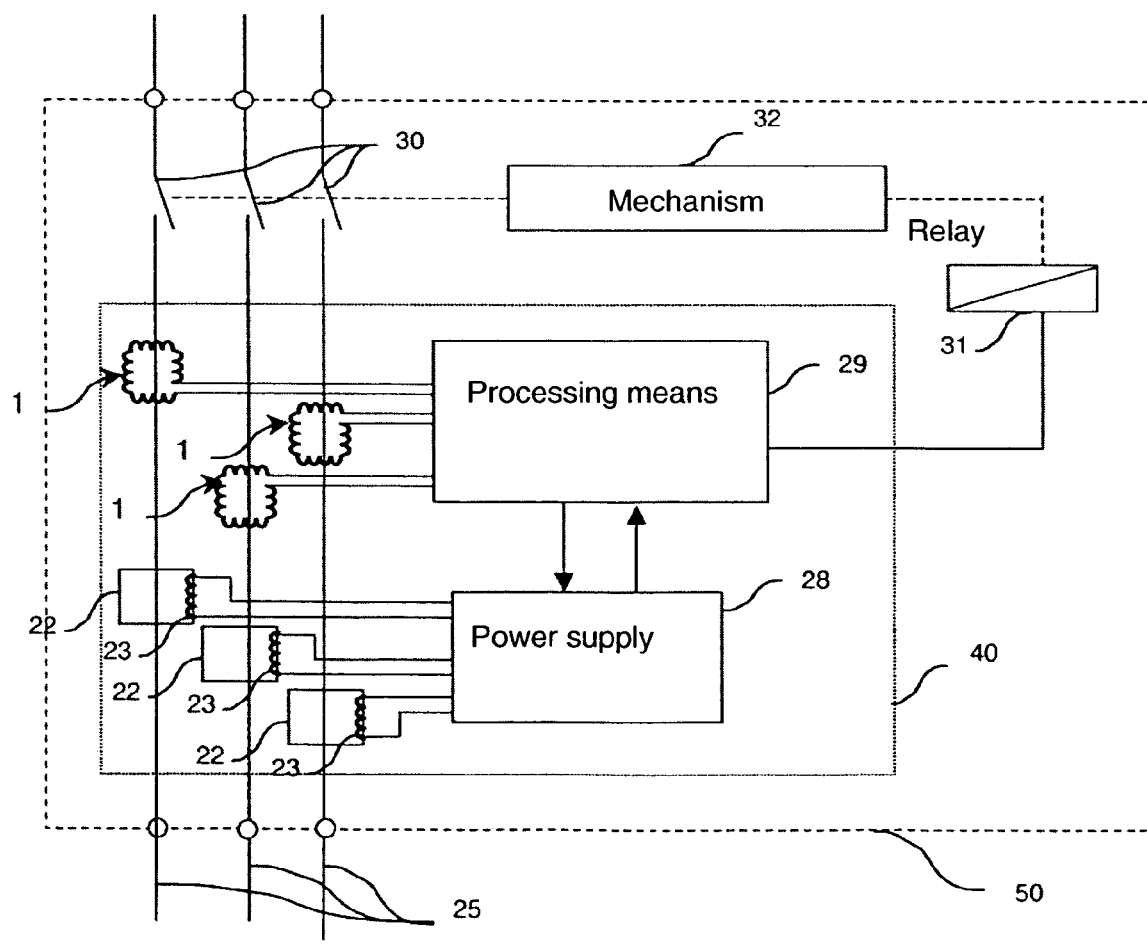
FIG. 12 represents a block diagram of a breaking device integrating current sensors according to the invention.

This assembly 20 can then be integrated in an electric trip unit 40 designed to control a breaking device such as a circuit breaker 50. The circuit breaker 50 is mounted on electric current conductors or lines 25. The magnetic current sensors are then connected to the power supply unit 28 of the trip unit. The current measuring devices 1 according to the invention are connected to the processing means 29. The processing means 29 are themselves supplied by the power supply unit 28. As represented in FIG. 12, several electrical poles of an installation can each comprise a Rogowski type current measuring device according to the invention and a magnetic current sensor.

If the processing means 29 receive, via the current measuring devices 1, information of a fault present on at least one of the lines 25, an opening control order of the contacts 30 can be sent to the opening mechanism 32 via the relay 31.

Figure 11:
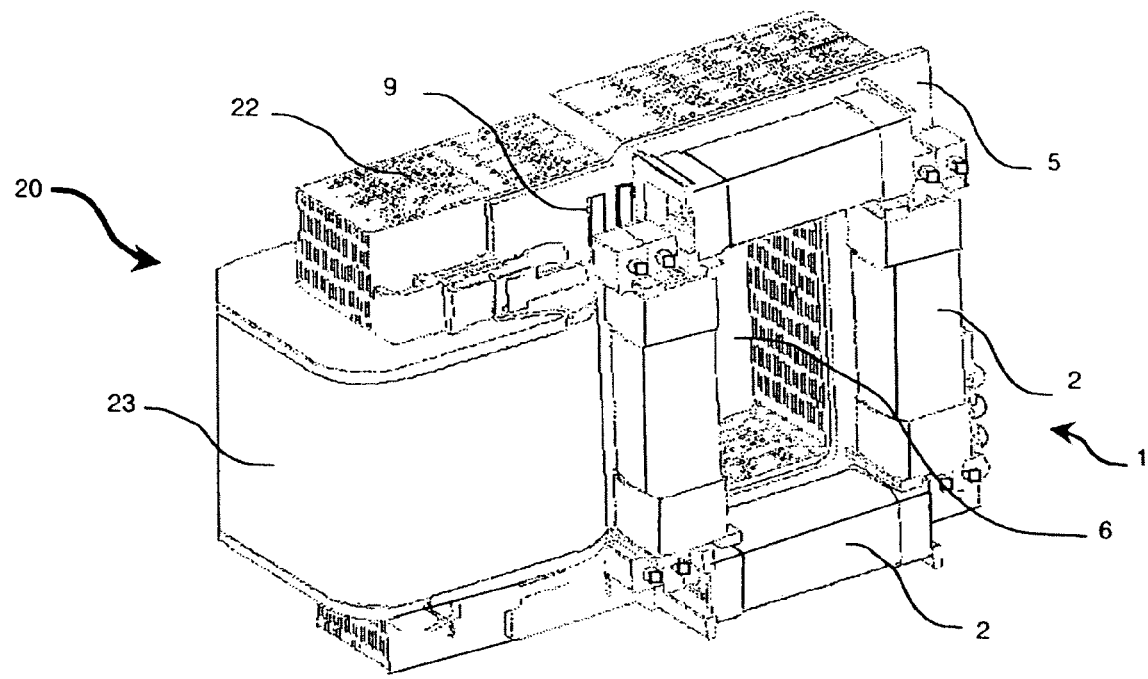
FIG. 11 represents a particular embodiment where the current measuring device according to the invention is combined with a magnetic current sensor.

As represented in FIG. 11, the magnetic current sensor is essentially composed of a coil 23 arranged on a magnetic circuit 22 thus forming the secondary winding of a current transformer. The primary circuit is formed by the electric current conductor or line 25 on which the assembly 20 is installed. This electric current conductor or line 25, not shown, is arranged inside an opening 6 arranged in the magnetic circuit 22. In addition, according to this embodiment, the primary circuit of the magnetic current sensor also corresponds to the primary circuit of the current measuring device 1 according to the invention. The four linear coils 2 mounted in series and forming a square are in fact arranged around the opening 6 in which said electric current conductor or line 25 passes. The printed circuit 5 acting as support for the four coils is used for electrical connection of said coils but also for electrical connection of the coil 23. Furthermore, it can be envisaged to use a single connection bus 10 for both of the sensors.

This configuration enables the overall size of the assembly to be greatly reduced and favors installation of this type of mixed current sensor 20 in electric trip units 40.

The invention claimed is:

1. Current measuring device comprising at least three coils with air cores, and electrically connected in series and forming a closed polygonal outline designed to surround a current conductor or line to perform current measurement wherein the local inductance of at least one of the ends of said coils is greater than the local inductance towards the central part of said coils, each of said coils being wound continuously from end to end without gaps, the coils are wound having at least two different coil diameters.

2. Current measuring device according to claim 1 wherein the local inductance at both ends of the coils is greater than the local inductance towards the central part of said coils.

3. Current measuring device according to claim 1 wherein the ends of the coils having inductance greater than the local inductance of the central part comprise a larger number of turns of wire per unit length than the number of turns of wire per unit length towards the central part of said coils.

4. Current measuring device according to claim 3 wherein the ends comprise a larger number of layers of turns of wire than the number of layers of turns of wire towards the central part of said coils, the winding pitch of the turns being constant.

5. Current measuring device according to claim 3 wherein the ends comprise, on one and the same layer of turns, a smaller winding pitch of the turns than the winding pitch of the turns towards the central part of said coils.

6. Current measuring device according to claim 3 wherein a variation of the number of turns at each end of the coils is made over a distance comprised between 10 and 20 percent of the total length of the coil.

7. Current measuring device according to claim 1 wherein the ends of the coils the local inductance whereof is higher than the local inductance of the central part comprise turns of a greater length than that of the turns towards the central part of said coils.

8. Current measuring device according to claim 1 wherein the radial surface of at least one of the ends of a coil is partially covered by an adjacent coil.

9. Current measuring device according to claim 1 wherein it is formed by four coils arranged so as to form a closed outline.

10. Current measuring device according to claim 9 wherein the outline has a square or rectangular polygonal shape.

11. A mixed current sensor comprising a magnetic current sensor having a coil wound around a magnetic circuit, comprising a current measuring device according to claim 1 arranged in such a way that the primary circuit of said magnetic sensor corresponds to the primary circuit of said current measuring device.

12. An electric trip unit comprising processing means wherein the processing means are connected to at least one current measuring device according to claim 1 to receive at least one signal representative of a primary current.

13. A breaking device comprising an opening mechanism of electrical contacts and a relay connected to a trip unit wherein the trip unit is a trip unit according to claim 11, said trip unit comprising a current measuring device according to claim 1.

14. A current measuring device according to claim 1 wherein the coils have ends that increase continuously in diameter from the diameter of the central part of the coil to a larger diameter at the end.

* * * * *